United States Patent
Sali et al.

[11] Patent Number: 5,999,456
[45] Date of Patent: Dec. 7, 1999

[54] FLASH EEPROM WITH CONTROLLED DISCHARGE TIME OF THE WORD LINES AND SOURCE POTENTIALS AFTER ERASE

[75] Inventors: Mauro Sali, S. Angelo Lodigiano; Corrado Villa, Sovico; Marcello Carrera, Trescore Balneario, all of Italy

[73] Assignee: STMicroelectronics S.r.l., Agrate Brianza, Italy

[21] Appl. No.: 08/943,391

[22] Filed: Oct. 3, 1997

Related U.S. Application Data

[62] Division of application No. 08/687,257, Jul. 25, 1996, Pat. No. 5,719,807.

[51] Int. Cl.⁶ .................................... G11C 11/34
[52] U.S. Cl. .................. 365/185.28; 365/185.25
[58] Field of Search ............. 365/185.28, 185.25, 365/185.33, 185.3, 185.31, 185.29

[56] References Cited

U.S. PATENT DOCUMENTS

| | | | |
|---|---|---|---|
| 4,797,856 | 1/1989 | Lee | 365/218 |
| 5,077,691 | 12/1991 | Haddad et al. | 365/218 |
| 5,357,466 | 10/1994 | Hong | 365/218 |
| 5,416,738 | 5/1995 | Shrivastava | 365/185.18 |
| 5,444,655 | 8/1995 | Yoshikawa | 365/185.18 |
| 5,452,248 | 9/1995 | Naruke et al. | 365/185.29 |
| 5,485,423 | 1/1996 | Tang et al. | 365/185.29 |
| 5,708,588 | 1/1998 | Haddad | 365/185.23 |

FOREIGN PATENT DOCUMENTS

| | | |
|---|---|---|
| 0 321 226 A1 | 6/1989 | European Pat. Off. . |
| 0 550 751 A1 | 7/1993 | European Pat. Off. . |
| 0 562 737 A2 | 9/1993 | European Pat. Off. . |
| 4132826A1 | 5/1992 | Germany . |

OTHER PUBLICATIONS

Feste, Jean–Pierre, "Une Seule Tension de 5V pour la Flash 16 Mbits," *Electronique 2045*(42):8, Nov., 1994.

Atsumi et al., "A 16–Mb Flash EEPROM With A New Self–Data–Refresh Scheme For A Sector Erase Operation," *IEICE Transactions on Electronics* E77–C(5):791–798, May, 1994.

*Primary Examiner*—A. Zarabian
*Attorney, Agent, or Firm*—David V. Carlson; Dennis M. de Guzman; Seed and Berry LLP

[57] ABSTRACT

A Flash EEPROM having at least one memory sector. The memory sector includes a plurality of rows and columns of memory cells; at least one negative voltage generator for generating a negative voltage commonly charging the plurality of rows to a negative potential during an erase pulse for erasing the memory cells of the at least one memory sector and control logic activating the negative voltage generator at the beginning of the erase pulse and deactivating the negative voltage generator at the end of the erase pulse. The Flash EEPROM having for controlling a discharge time of the rows of the at least one memory sector at the end of the erase pulse.

13 Claims, 10 Drawing Sheets

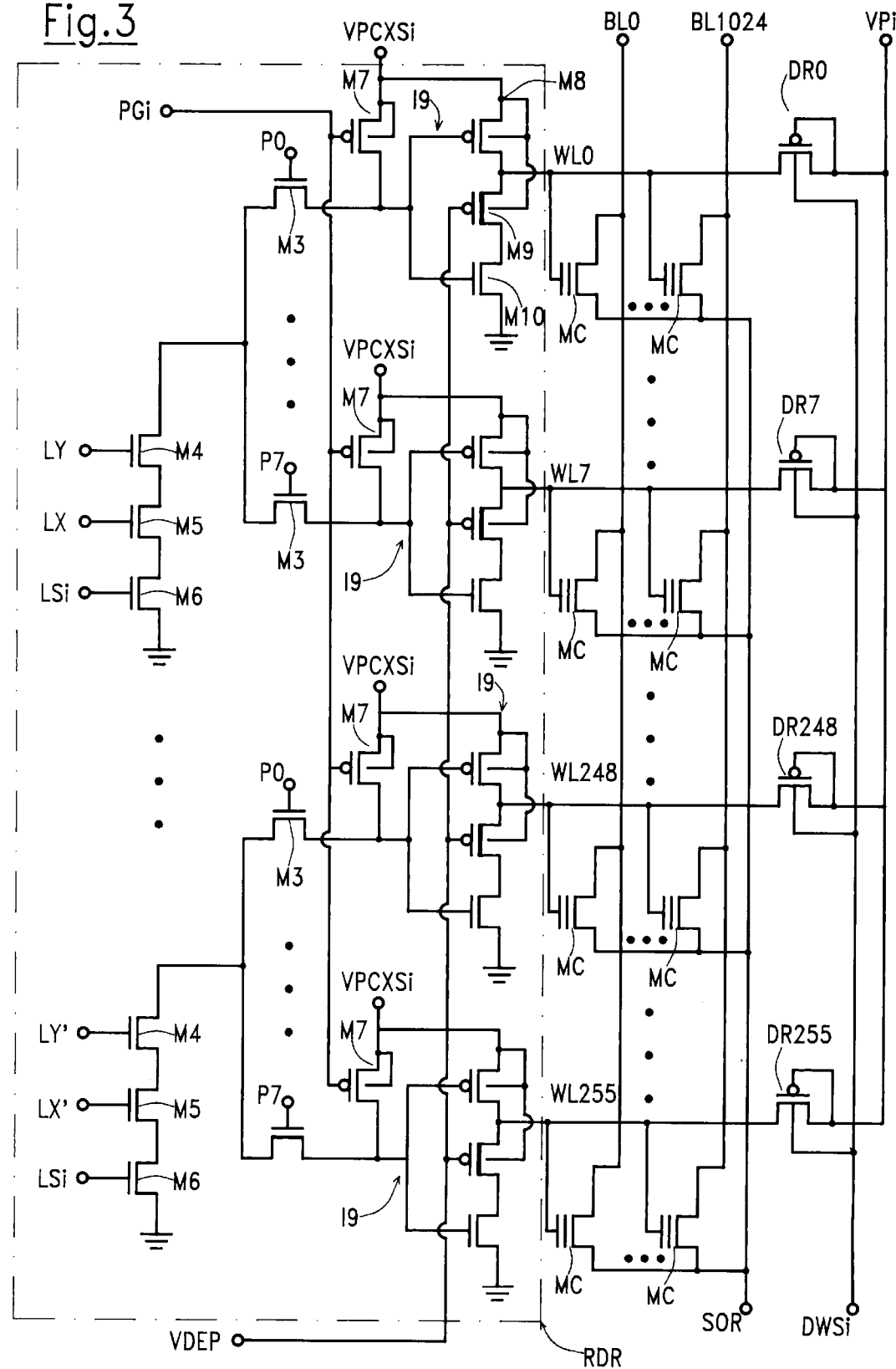

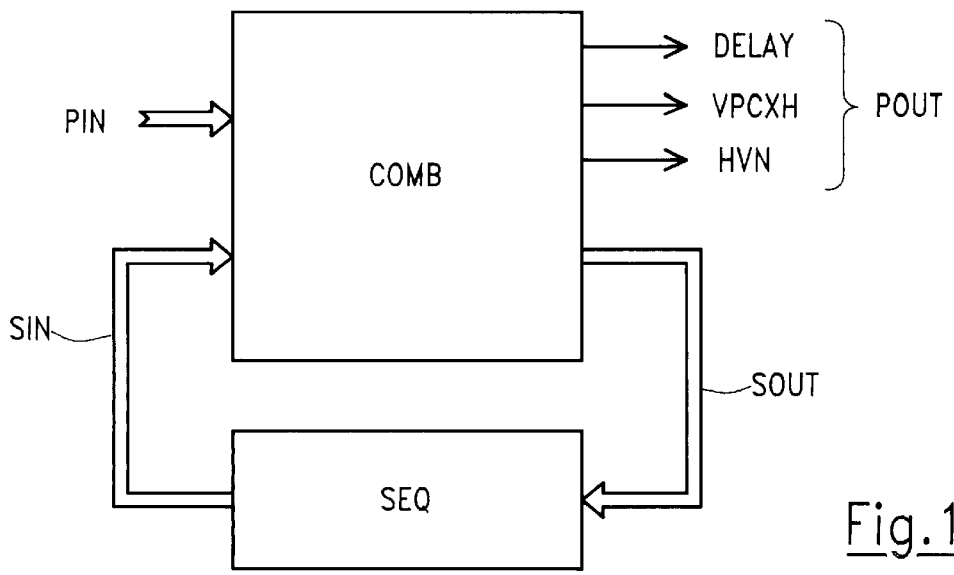
Fig.13
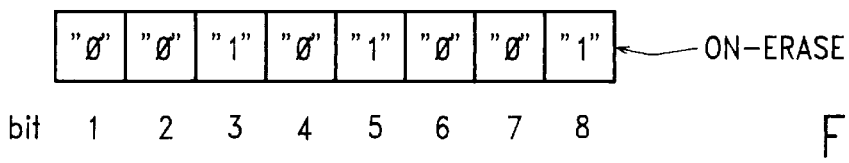
Fig.14
Fig.15
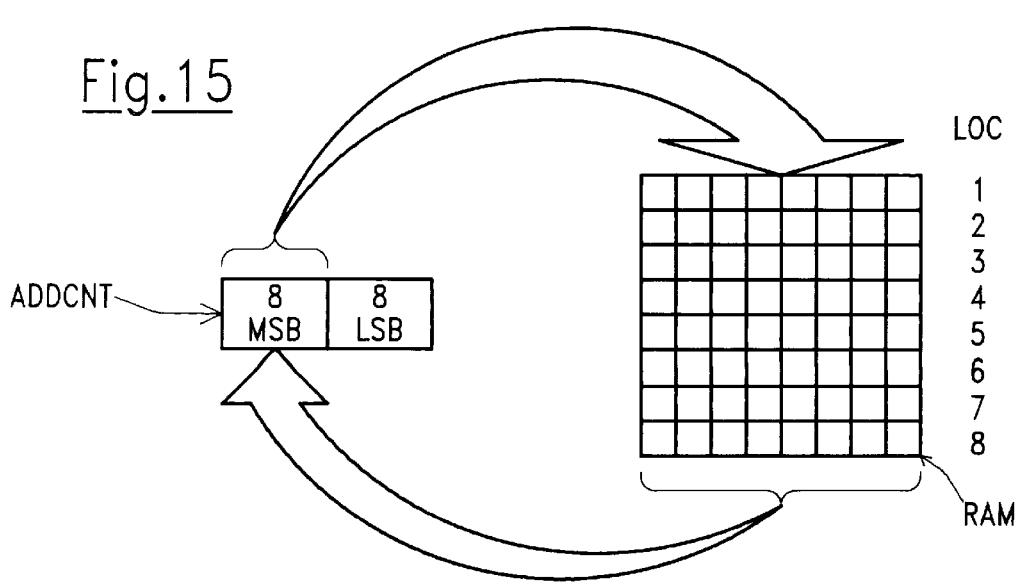

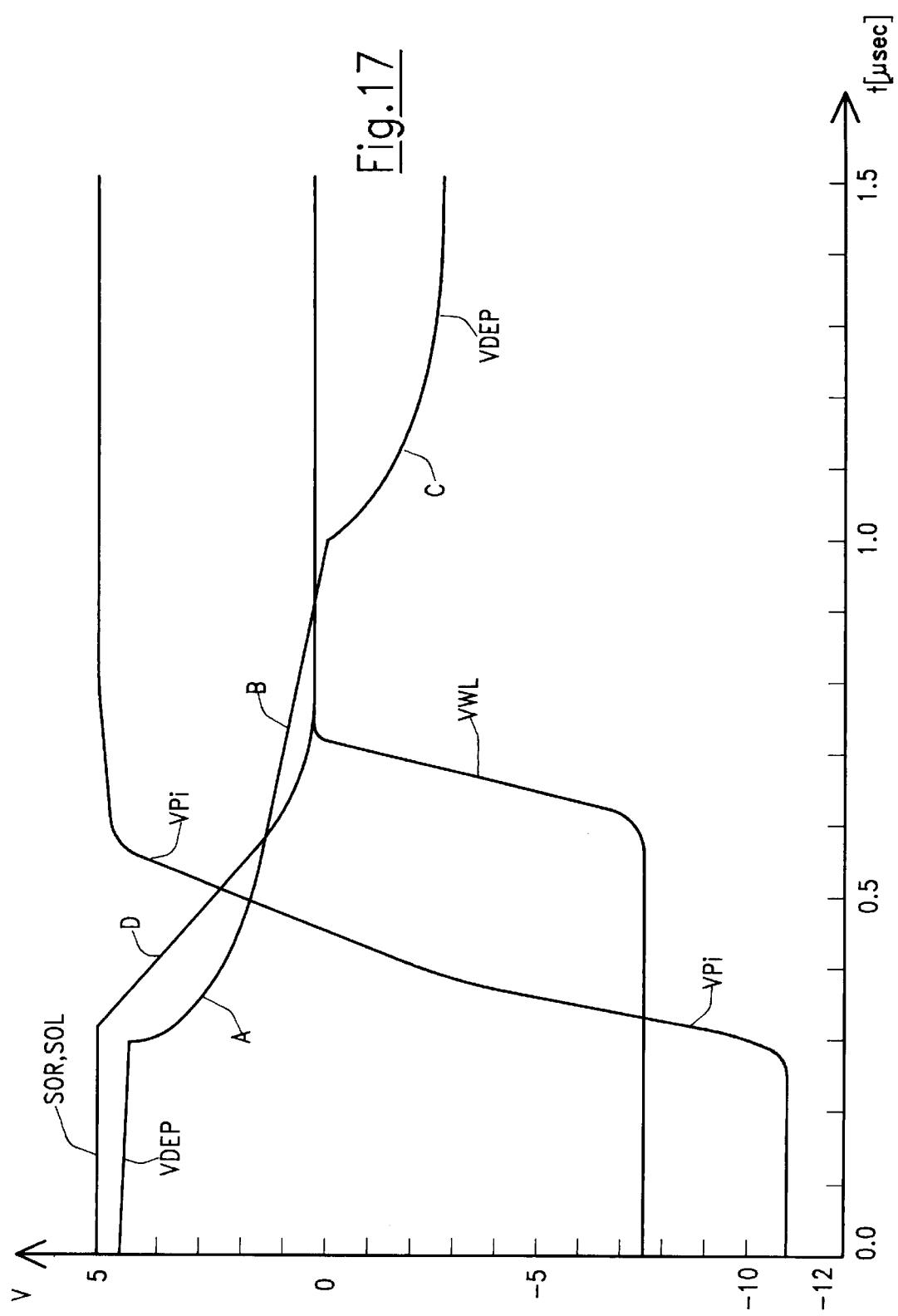

FLASH EEPROM WITH CONTROLLED DISCHARGE TIME OF THE WORD LINES AND SOURCE POTENTIALS AFTER ERASE

Cross-Reference to Related Application

This application is a divisional of U.S. patent application Ser. No. 08/687,257, filed Jul. 25, 1996, now U.S. Pat. No. 5,719,807.

TECHNICAL FIELD

The present invention relates to a Flash EEPROM with controlled discharge time of the word lines and source potentials after erase.

BACKGROUND OF THE INVENTION

Flash EEPROMs are characterized by the fact that all the memory cells of the memory array, or at least large groups of them (memory sectors), can be electrically erased at a time.

According to a preferred erasing technique, described for example in the co-pending European Patent Application No. 95830253.1 filed on Jun. 19, 1995 in the name of the same applicant, erasing of the memory cells of the memory array or of a given memory sector is performed by biasing the word lines of the memory array or of the memory sector with a negative erase voltage ranging from −8 V to −12 V, and applying a positive erase voltage of approximately 5 V to the sources of the memory cells. Applicant also incorporates by reference European Patent Application No. 95830348.9, filed Jul. 31, 1995 (corresponding to U.S. Pat. No. 5,719,807) European Patent Application No.95830317.4, filed Jul. 24, 1995 (corresponding to U.S. application Ser. No. 08/687,145) and European Patent Application No.95830351.3, filed Aug. 2, 1995 (corresponding to U.S. application Ser. No. 08/692,936).

After the erase, all the word lines and all the sources of the memory cells of the memory array or of the memory sector must be brought to the ground potential. This involves the discharge of large capacitances. In fact, when the potential of the word lines is brought to the negative erase voltage, the control gate capacitances of all the memory cells connected to the word lines are charged to a voltage ranging from −8 V to −12 V. Similarly, when the potential of the sources of the memory cells is brought to the positive erase voltage, the source capacitance of all the memory cells is charged to a voltage of approximately 5 V. In Flash EEPROM of the size of some megabits, the sum of the control gate capacitances, as well as the sum of all the source capacitances of the memory cells, can be of the order of some hundreds of picofarads. The rapid discharge of such large capacitances gives rise to high currents flowing in the metal lines which deliver the power supply voltages inside the memory device. To prevent problems of electromigration in such metal lines, these must be overdimensioned, with an obvious increase of chip area.

SUMMARY OF THE INVENTION

In view of the state of the art described, it is an object of the present invention to provide a Flash EEPROM which is not affected by the abovementioned problem.

According to the present invention, such object is attained by a Flash EEPROM having at least one memory sector. The memory sector includes a plurality of rows and columns of memory cells; at least one negative voltage generator associated to said at least one memory sector for generating a negative voltage commonly charging said plurality of rows to a negative potential during an erase pulse for erasing the memory cells of said at least one memory sector; and control logic activating said negative voltage generator at the beginning of said erase pulse and deactivating said negative voltage generator at the end of the erase pulse, wherein the control logic controls a discharge time of the rows of the at least one memory sector at the end of the erase pulse.

With the present invention, it is possible to control the discharge current of the word line capacitances after an erase pulse. In this way, it is possible to avoid electromigration problems in the metal lines which deliver the power supply voltages inside the Flash EEPROM.

The Flash EEPROM also includes a source switch associated with said at least one memory sector for switching a potential of a common source line connecting together source electrodes of the memory cells of the memory sector from the ground potential to a positive potential during the erase pulse.

According to a preferred embodiment, the source switch includes a source discharge circuit, controlled by said control circuit controls the discharge time of the rows to control a discharge time of the common source line from the positive potential to the ground potential at the end of the erase pulse.

In this way, also the discharge current of the source capacitances of the memory cells can be controlled. It is thus possible to exploit the charge stored in the word line capacitances to discharge the source line capacitances.

These and other features and advantages of the present invention will be made more evident by the following detailed description of a particular embodiment, described as a non limiting example in the annexed drawings, wherein:

BRIEF DESCRIPTION OF THE DRAWINGS

FIG. 3 is a diagram showing a half-sector of the Flash EEPROM of FIG. 1, a row decoderr circuit associated to said half-sector, and word line diodes associated to each word line of the half sector.

FIG. 13 is a schematic diagram of a sequential machine included in the Flash EEPROM of FIG. 1 for controlling the internal operation thereof.

FIG. 14 is a schematic diagram of a memory register of the sequential machine of FIG. 13.

FIG. 15 is a schematic diagram of a RAM of the sequential network of FIG. 13.

FIG. 17 is a time diagram of some signals of the Flash EEPROM at the end of an erase pulse.

DETAILED DESCRIPTION OF THE INVENTION

Figure 1:
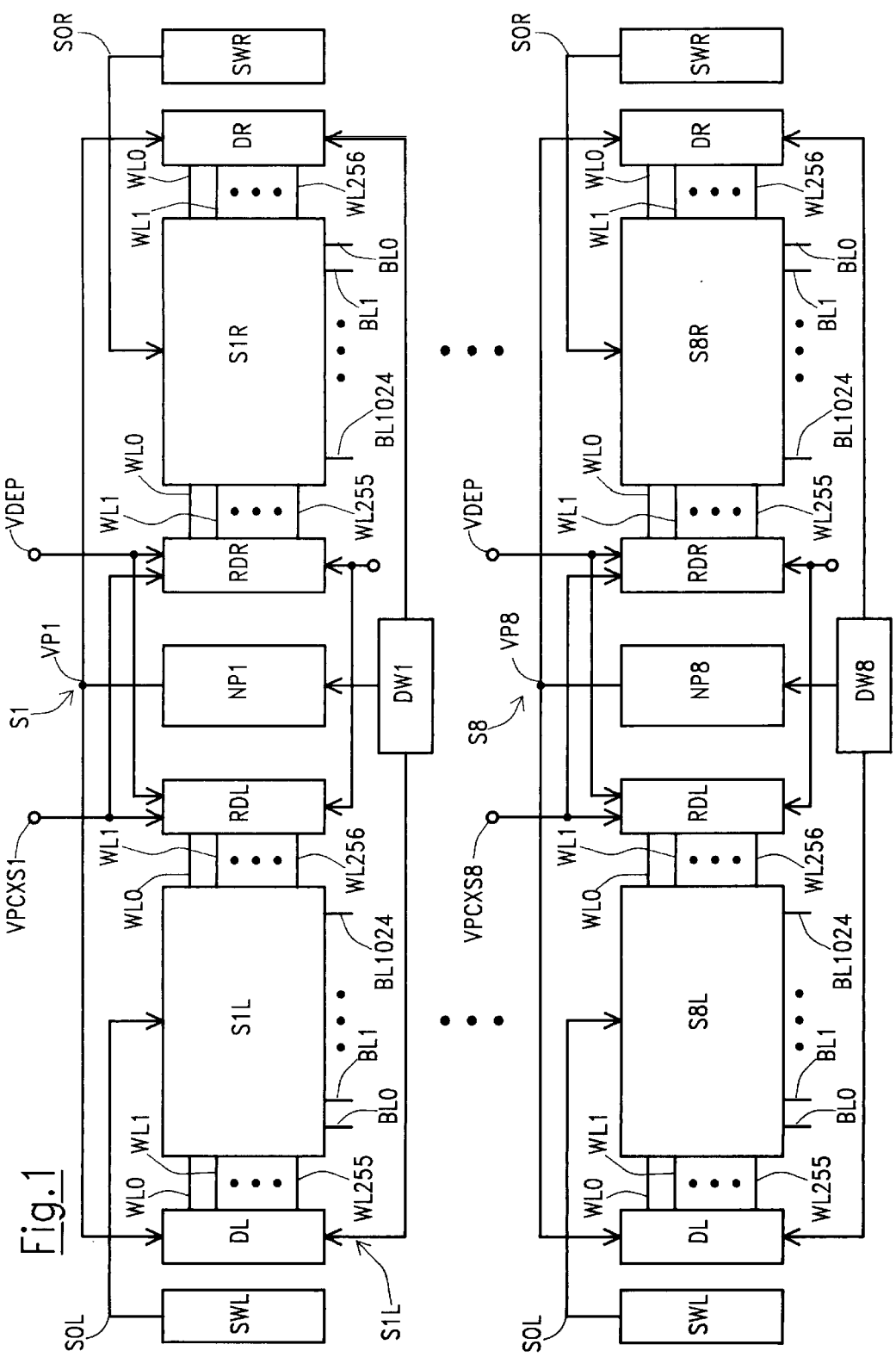
FIG. 1 is a schematic floor plan of a Flash EEPROM according to the present invention, showing the main building blocks.

FIG. 1 is a schematic floor plan of a Flash EEPROM, for example a 4 Mbit one. The memory device includes eight memory sectors S1–S8, each one of 512 kbit. A memory sector is the smallest portion of the memory device that can be individually erased.

Each sector S1–S8 is in turn divided in two half-sectors, namely a right half-sector S1R–S8R and a left half-sector S1L–S8L. Each half-sector contains 256 rows (word lines) WL0–WL255 and 1024 columns (bit lines) BL0–BL1024, for a total of 256 kbit.

Assuming that the Flash EEPROM has eight output data signals, byte-wide output data bus, the 2048 bit lines of each sectors are grouped together in eight groups of 256 bit lines four groups of 256 bit lines per half-sector, each group being connected to a respective sensing circuit (not shown) whose output forms one of the eight output data signals.

Each half-sector has associated therewith a row decoder RDR, RDL for selecting one word line among the 256 word lines WL0–WL256, and a source switch circuit SWR, SWL for switching the potential of a common source line SOR, SOL to which the source electrodes of all the memory cells in the respective half-sector are connected, as shown in FIG. 3.

Figure 5:
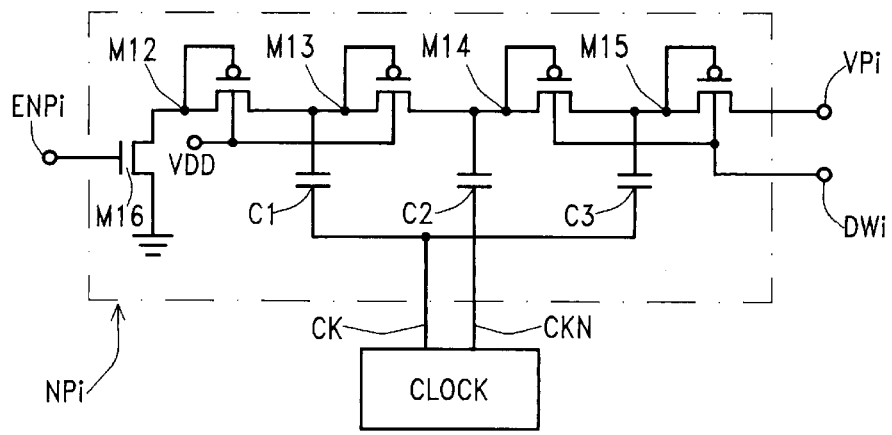
FIG. 5 is a diagram of a negative charge pump circuit associated to a sector of th Flash EEPROM.

A negative charge pump circuit NP1–NP8 is associated with each sector S1–S8; the detailed structure of one of the eight negative charge pump circuits NP1–NP8 is shown in FIG. 5. In each sector, the respective negative charge pump circuit generates a negative voltage VP1–VP8 which is supplied to all the word lines WL0–WL256 of the right and left half-sectors through respective diodes, which, as shown in FIG. 3, are diode-connected P-channel MOSFETs, connected in series to each word line. These diodes are schematically indicated in FIG. 1 by two blocks DR and DL. Also associated with each sector is a circuit DW1–DW8 for controlling the potential of the well bulk electrode of the diode-connected P-channel MOSFETs associated with the word lines. The circuits DW1–DW8 also control the potential of the well (bulk electrode) of the MOSFETs in the last stages of the negative charge pump circuits NP1–NP8.

Further associated with each sector, even if not shown in FIG. 1, is a circuit for controlling a sector supply voltage VPCXS1–VPCXS8 for the respective sector S1–S8. Such a sector supply voltage VPCXS1–VPCXS8 supplies the row decoders RDR, RDL, and the circuit DW1–DW8.

Figure 2:
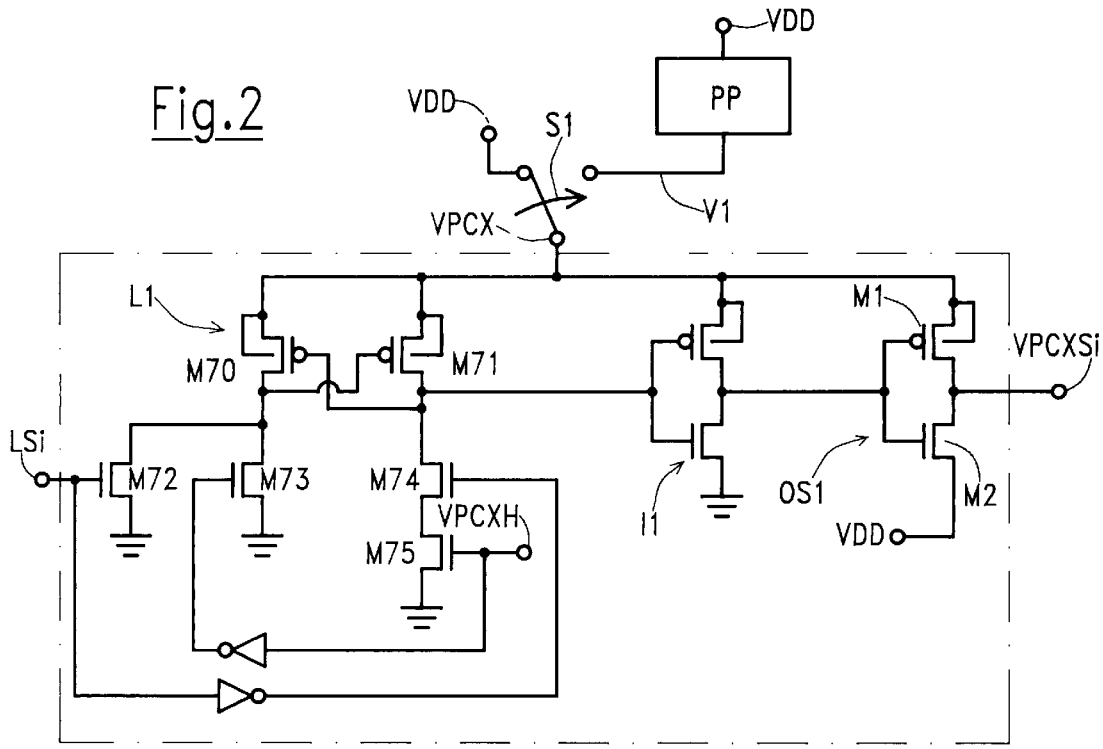
FIG. 2 is a diagram of a circuit for controlling the power supply of a memory sector of the Flash EEPROM.

FIG. 2 shows the detailed structure of one of the eight circuits for controlling the sector supply voltage of one of the eight sectors S1–S8. Substantially, this circuit allows to switch the sector supply voltage VPCXSi (i=1 .. 8) between an external power supply VDD of the memory device, typically a 5 V power supply, and an internal power supply voltage VPCX, which is a global signal for the whole memory device. The internal power supply voltage VPCX is in turn switched by switch S1 between the external power supply voltage VDD and a positive output voltage V1 generated by a group of positive charge pump circuits PP.

The circuit of FIG. 2 has a latch L1, an inverter I1 and an output stage OS1. The latch L1 includes two cross-connected P-channel MOSFETs M70, M71 and two N-channel MOSFETs M72, M73. The two N-channel MOSFETs M72, M73 are parallelly connected between the drain electrode of M70 and ground; two N-channel MOSFETs M74, M75 are connected in series between the drain of M71 and ground. The output stage OS1 is a highly-conductive P-channel MOSFET M1 with source connected to VPCX and an N-channel MOSFET M2 with source connected to VDD. The switching of VPCXSi (i=1 . . . 8) is controlled by two logic signals, namely LSi and VPCXH. LSi is a sector selection signal which allows the selection of the sector Si. VPCXH is a signal controlling the commutation of the switch S1; VPCXH is generated by a sequential machine, shown in FIG. 13, included in the memory device for controlling the internal operation thereof. The voltage V1 generated by the group of positive charge pump circuits PP can take three different values, namely 12 V in PROGRAM mode, 7 V during the PROGRAIMMED BYTE VERIFY step after each programming pulse (margin-mode reading of the programmed memory cells), and 4 V during the ERASED BYTE VERIFY step which is executed after each erasing pulse, as will be described in the following (margin mode reading of the erased memory cells).

When VPCXH="0", i.e. in READ mode and in ERASE mode, VPCX=VDD and VPCXSi=VPCX=VDD independently of LSi. When VPCXI="1", i.e. in PROGRAM mode, PROGRAMMED BYTE VERIFY mode and ERASED BYTE VERIFY mode, VPCX=V1. If LSi="0" (i.e. if sector Si is not selected), then VPCXSi is connected to VDD through M2; differently, if LSi="1" (i.e. if sector Si is selected), then VPCXSi=VPCX=V1.

FIG. 3 shows the detailed structure of one of the sixteen half-sectors of the memory device, namely a right half-sector SiR (i=1 . . . 8), and of the respective row decoder circuit RDR. The left half-sectors SiL and the associated row decoder circuits RDL are identical in their structure. The row decoder circuit RDR uses a conventional two-level decoding scheme: the 256 word lines WLO–WL255 are grouped together in 32 groups of eight word lines each. Two groups of first-level selection signals LX . . . LX', LY . . . LY', together with the sector selection signal LSi, allow the selection of one group of eight word lines among the 32 groups. A group of eight second-level selection signals P0–P7 allow the selection of one word line in the selected group of eight word lines. The first-level selection signals LX . . . LX', LY . . . LY', and the sector selection signals LSi control respective N-channel MOSFETs M3–M6 connected in series, which are common for one group of eight word lines. Inside each group of eight word lines, the second-level selection signals P0–P7 control respective N-channel MOSFETs M3, one for each word line, which have a source electrode commonly connected to the drain electrode of the respective MOSFET M4 associated to said group of eight word lines. For each word line, a P-channel MOSFETs M7 is connected between the sector supply voltage VPCXSi and the drain of the respective MOSFET M3. For a given word line, MOSFETs M3–M7 form a NOR circuit, non full CMOS. Within the NOR circuit, M7 is a pull-up transistor and is controlled by a signal PGi, common for the whole sector Si and the signal PGi is controlled by the circuit of FIG. 4, which will be described in the following. For each word line, the output of each one of said NOR circuits supply a final inverter I9 that drives a respective word line. The final inverter I9 includes a P-channel MOSFET M8, a P-channel depletion MOSFET M9 and a, N-channel MOSFET M10 connected in series between VPCXSi and ground. The MOSFETs M8 and M10 are controlled by the output of the respective NOR circuit M3–M7 associated to the respective word line. The MOSFET M9 is controlled by a signal VDEP, common to all the sectors of the memory device, controlled by the circuit shown in FIGS. 7–10, which will be described in the following.

Figure 6:
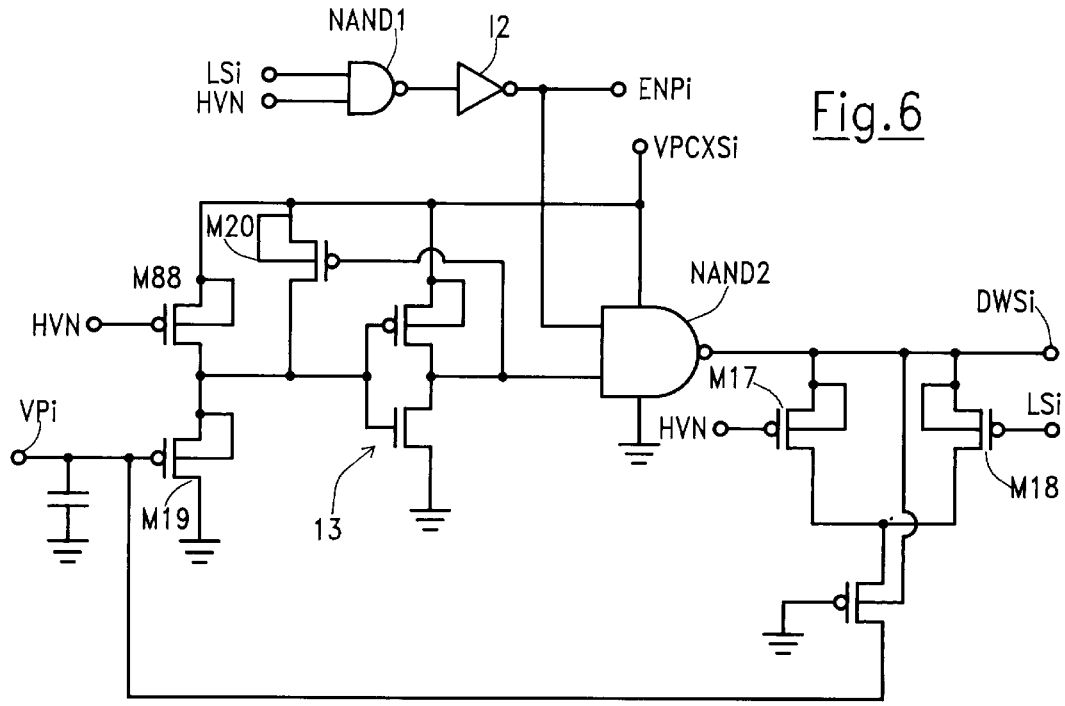
FIG. 6 is a diagram of a circuit for controlling the potential of the bulk electrode of the word line diodes of FIG. 3 and of the diodes of the negative charge pump circuit of FIG. 5.

In FIG. 3 are also shown two bit lines BL0 and BL1024, and eight memory cells MC formed by floating gate MOS transistors with a control gate electrode connected to a respective word line, a drain electrode connected to a respective bit line, and a source electrode connected to the common source line SOR to which the source electrodes of all the other memory cells of the half-sector are also connected. Also visible in FIG. 3 are four diode-connected P-channel MOSFETs DR0, DR7, DR248, DR255, each-connected in series between a respective word line WL0, WL7, WL248, WL255 and the negative voltage VPi generated by the respective negative charge pump circuit NPi associated to the memory sector Si. The well of the diode-connected MOSFETs DR0, DR7, DR248, DR255 is controlled by the signal DWSi generated by the circuit Dwi, as shown in FIG. 6, associated to the memory sector Si.

Figure 4:
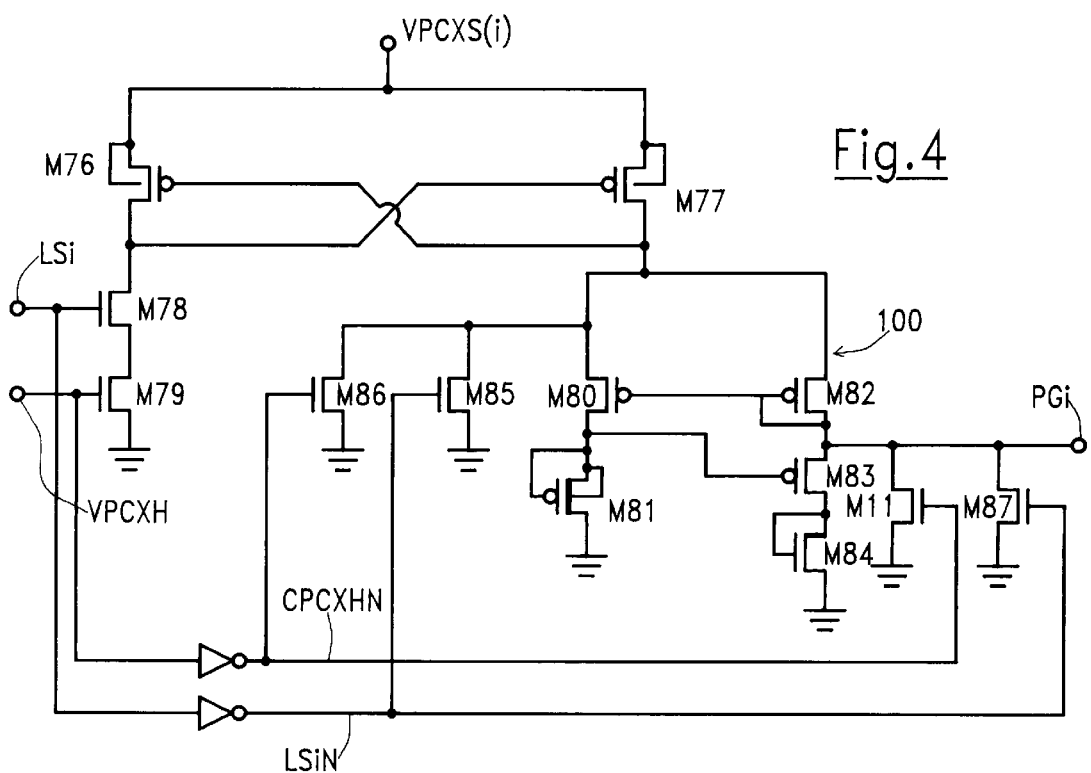
FIG. 4 is a diagram of a circuit for controlling a first bias signal for the row decoder circuit of FIG. 3.

FIG. 4 shows the detailed structure of the circuit for controlling the signal PGi which controls all the pull-up P-channel MOSFETs P2 of the row decoders RDR, RDL of the sector Si. The circuit includes two cross-connected P-channel MOSFETs M76, M77. MOSFET M76 is included in a first circuit branch having two serially connected N-channel MOSFETs M78, M79 respectively controlled by the sector selection signal LSi and by the signal VPCXH mentioned in connection with the circuit of FIG. 2. MOSFET M77 belongs to another circuit branch which includes a current mirror 100. The current mirror 100 has a first circuit branch containing a P-channel MOSFET M80 and a P-channel depletion MOSFET M81 connected in series, and a second circuit branch containing a diode-connected P-channel MOSFET M82, a P-channel MOSFET M83 and a diode-connected N-channel MOSFET M84 connected in series. The drain of M82 controls the signal PGi. Also connected to M77 are two parallelly-connected N-channel MOSFETs M85, M86 respectively cornrolled by the logic complements LSiN, VPCXHN of the signals LSi and VPCXH. The signal PGi is further coupled to ground through two parallelly-connected N-channel MOSFETs M11, M87 respectively controlled by the signals VPCXHN, LSiN.

In READ mode and in ERASE mode, when VPCXH="0", M79 is off and M86 and M11 are on; the current mirror 100 is deactivated, and PGi is tied to ground by M11. In PROGRAM mode, VPCXH="1": M79 is on and M11 is off If the memory sector Si is not selected, LSi="0", M78 is off, M85 and M87 are on: the current mirror 100 is deactivated, and PGi is tied to ground by M87. If instead the memory sector Si is selected, LSi="1", M78 is on, M85 is off and M87 is off, the current mirror 100 is activated; PGi is thus biased at a voltage a little higher, in absolute value, than the threshold voltage of the pull-up MOSFETs M7 in the row decoder circuits.

FIG. 5 shows the detailed structure of one of the eight negative charge pump circuits NP1–NP8. Conventionally, the circuit includes a chain of diode-connected P-channel MOSFETs M12–M15, four in this example. Three coupling capacitors C1–C3 have one plate connected to the common node between M12 and M13, M13 and M14, and M14 and M15, respectively, and another plate driven by a respective one of two clock signals CK, CKN generated by a clock generator CLOCK common to all the eight negative charge pump circuits NP1–NP8. The drain electrode of M12 is coupled to ground through an enabling N-channel MOSFET M16 controlled by a pump enabling signal ENPi which is activated when the respective negative charge pump NPi must be activated. The source electrode of M15 is the negative voltage VPi which is supplied to the word lines of the sector Si through the word line diodes in the blocks DR, DL. The well of the first two P-channel MOSFETs M12, M13 is connected to the external power supply VDD, while the well of the last two P-channel MOSFETs M14, M15 is connected to the signal DWSi generated by the respective circuit DWi associated to the memory sector Si.

FIG. 6 shows the detailed structure of one of the eight circuits DW1–DW8 for controlling the potential of the wells of the diode-connected P-channel MOSFETs DR, DL associated with the word lines in each sector, and of the diode-connected P-channel MOSFETs M14, M15 of the negative charge pump-circuit NPi. The circuit also controls the activation of the pump enabling signal ENPi, that activates the negative charge pump circuit NPi.

As visible, the circuit has a first two-input NAND gate NAND1 supplied with the sector selection signal LSi and with a global logic signal HVN, generated by the sequential machine shown in FIG. 13. The signal HVN is activated in ERASE mode when an erase pulse is to be applied to the memory cells of one or more sectors. The output of NAND1 is supplied to an inverter I2 whose output is the pump enabling signal ENPi which, when activated, enables the respective negative charge pump circuit NPi. The pump enabling signal ENPi also supplies a second two-input NAND gate NAND2, powered by sector supply voltage VPCXSi, whose output is the signal DWSi supplied to the well bulk electrode of the diode-connected P-channel MOSFETs DR, DL associated to the word lines and of the last two diode-connected P-channel MOSFETs M14, M15 of the respective negative charge pump circuit NPi. The other input of NAND2 is the output of an inverter I3, also powered by VPCXSi. The input of I3 is coupled to VPCXSi by a P-channel MOSFET M20 with gate connected to the output of I3; a P-channel MOSFET M19, controlled by the output voltage VPi of the negative charge pump circuit NPi, couples the input of I3 to ground. A pull-up P-channel MOSFET M88, controlled by the signal HVN, is connected between the input of I3 and VPCXSi.

When not in ERASE mode, HVN="0", or when in ERASE mode and the memory sector Si is not to be erased, the signal ENPi="0"; the negative charge pump circuit NPi associated to the memory sector Si is thus deactivated. Since ENPi="0" and the signal dWSi is tied to the voltage supply of NAND0, the sector power supply VPCXSi=DWSi. Further, the output voltage VPi of the negative charge pump NPi is tied to DWSi, i.e. to VPCXSi, by the fact that at least one of the P-channel MOSFETs M17 and M18 is on.

When the sector Si is to be erased, the signals HVN and LSi are both high, ENPi="1", and the negative charge pump circuit NPi is activated. M17 and M18 are both off, VPi goes negative, but until it reaches a value of about −2.5 V the gate drive of M19 is not sufficient to cause inverter I3 to switch: the output of I3 is a logic "1", and DWSi is tied to VPCXSi, which in ERASE mode is equal to the external power supply VDD. When VPi reaches a voltage value of approximately −2.5 V, M19 becomes sufficiently conductive to cause the inverter I3 to switch to "0"; this causes DWSi to be tied to ground. In this way, when the negative voltage VPi is become sufficiently negative, the potential of the well of the diodes DR, DL associated to the word lines and of the diodes M14, M15 in the negative charge pump circuit NPi is switched from VDD to ground. This allows to reduce the electric stress on the junctions of the diode-connected P-channel MOSFETs, and the body effect on their threshold voltage.

FIGS. 7–10 show the detailed structure of a circuit for controlling the signal VDEP that in turn controls the P-channel depletion MOSFETs M9 in the row decoder circuits RDR, RDL in all the sectors S1–S8 of the flash EEPROM. The circuit includes a charge circuit CHC, shown in FIG. 7, a discharge circuit DCHC, shown in FIG. 8, and a control circuit CC, shown in FIGS. 9 and 10.

Figure 7:
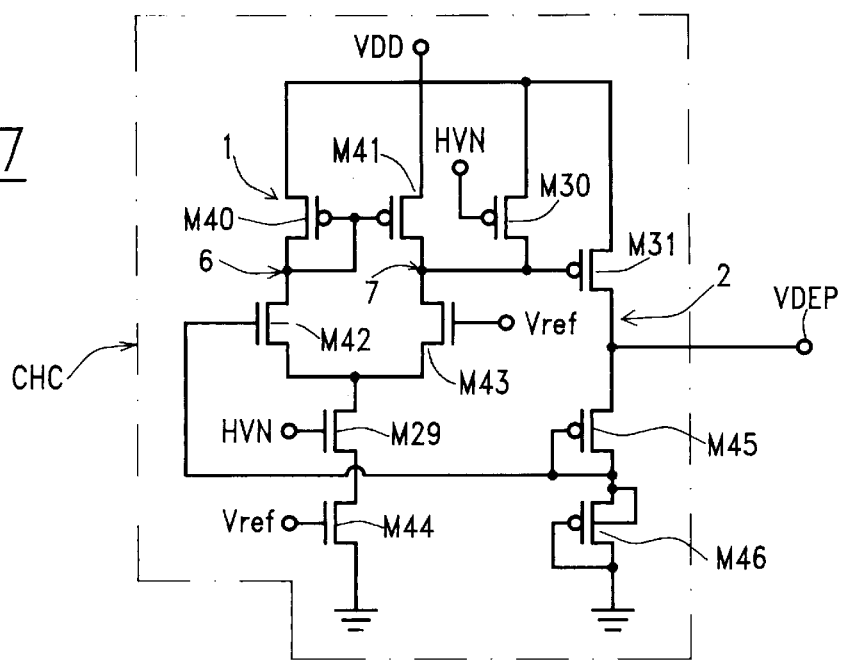
FIGS. 7 to 10 are diagrams of a circuit for controlling a second bias signal for the row decoder circuits.

With reference to FIG. 7, the charge circuit CHC contains an operational amplifier 1 and an output stage 2. The operational amplifier 1 has two circuit branches 6, 7; branch 6 includes a diode-connected P-channel load MOSFETs M40 and an N-channel MOSFETs M42; branch 7 includes a P-channel load MOSFET M41 and an N-channel MOSFET M43. The common source of M42 and M43 is coupled to ground through an N-channel MOSFET M29 and an N-channel MOSFET M44, respectively controlled by the signal HVN and by a reference voltage Vref. The output stage includes a P-channel pull-up MOSFET M31 and two diode-connected P-channel MOSFETs M45, M46. The drain of M31 forms the output of the charge circuit CHC, that-is connected to the signal line VDEP. One input of the operational amplifier 1 is supplied with a reference voltage Vref approximately equal to 2 V; the reference voltage Vref can be generated by a bandgap reference generator integrated in the Flash EEPROM. Another input of the operational amplifier 1 is supplied with a feedback signal proportional to the output signal VDEP of the charge circuit CHC. A P-channel MOSFET M30, controlled by the signal HVN, is also provided between VDD and the gate electrode of M31.

It is possible to see that when HVN="0" the charge circuit CHC is deactivated, and its output is in a high-impedance condition. In fact, when HVN="0", the N-channel MOSFET M29, which provides the operational amplifier 1 with a path to ground, is off, and the P-channel MOSFET M30 drives the gate voltage of the pull-up P-channel MOSFET M31 in the output stage 2 to VDD. When HVN switches to a logic "1", i.e. during an erase pulse, the charge circuit CHC is activated to bias the signal VDEP to a voltage approximately equal to twice the voltage Vref, i.e. approximately 4 V.

Figure 8:
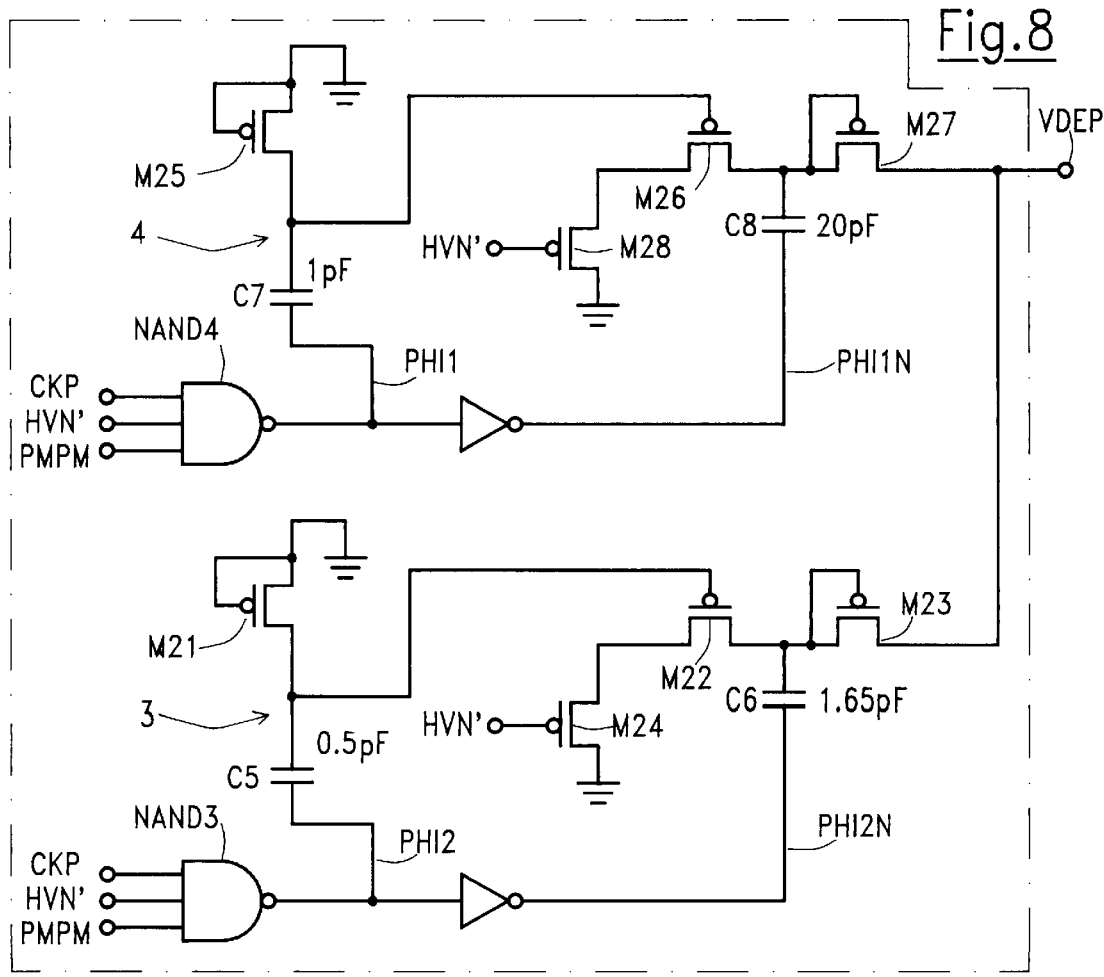

With reference to FIG. 8, the discharge circuit DCHC comprises two negative charge pump circuits 3, 4.

The first negative charge pump circuit 3 contains a boosting circuit having a diode-connected P-channel MOSFET M21 with drain connected to ground and source connected to a first plate of a capacitor C5 with a capacitance of approximately 0.5 pF; the second plate of C5 is driven by a clock signal PFH2. The source of M21 drives a pass P-channel MOSFET M22 with drain connected to a first plate of a capacitor C6 with a capacitance of approximately 1.65 pF; the second plate of C6 is driven by a clock signal PHI2N which is the logic complement of PHI2. The drain of M22 is also connected to the drain of a diode-connected P-channel MOSFET M23 whose source is connected to the signal VDEP. The source of M22 is also connected to ground through an enable N-channel MOSFET M24 controlled by a signal HVN' which is the logic complement of the signal HVN. The clock signal PHI2 is the output of a three-input NAND gate NAND3 supplied with a clock signal CKP The signal HVN' and an enable signal PMPM, which is activated by the control circuit CC, will be described below with reference to FIG. 9.

The negative charge pump circuit 4 is identical to the previously described negative charge pump circuit 3, and includes a boosting circuit having a diode-connected P-channel MOSFET NC5 and a capacitor C7 with a capacitance of approximately 1 pF, a P-channel pass MOSFET M26, a capacitor C8 coupled to the drain of M26 and having a capacitance of approximately 20 pF, a diode-connected P-channel MOSFET M27 with drain connected to the drain of M26 and source connected to the signal VDEP, and an enable N-channel MOSFET M28 controlled by the signal HVN'. Capacitor C7 is driven by a clock signal PH1 and capacitor C8 is driven by another clock signal PHIN which is the logic complement of PHI1. PHI1 is the output of a NAND gate NAND4 supplied with the clock signal CKP The signal HVN' and an enable signal PMPG which is also activated by the control circuit CC is described with reference to FIG. 10.

The two negative charge pump circuits 3, 4 are activated when HVN'="1", i.e. when HVN="0", and when the respective enable signal PMPN, PMPG is activated. As already mentioned with reference to FIG. 7, in this condition the charge circuit CHC is deactivated, so that the signal VDEP can be driven by the negative charge pump circuits.

Both the negative charge pump circuits 3, 4 drive when the signal VDEP is activated to a voltage of approximately −4 V. However, as can be understood from the capacitance values in the two negative charge pump circuits 3 and 4, the second negative charge pump circuit 4 has a much higher current capability than the first negative charge pump circuit 3.

Figure 9:
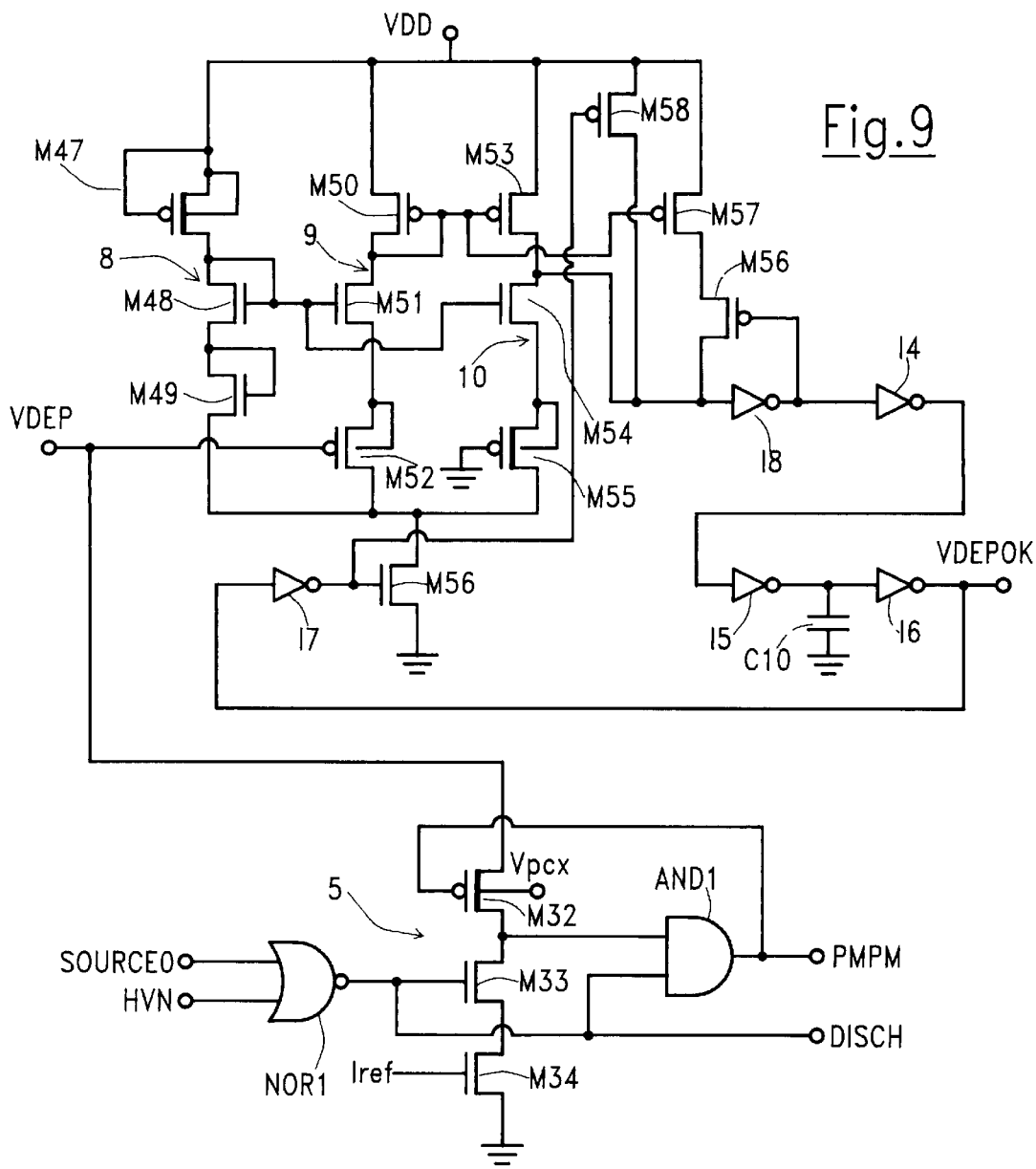
Figure 10:
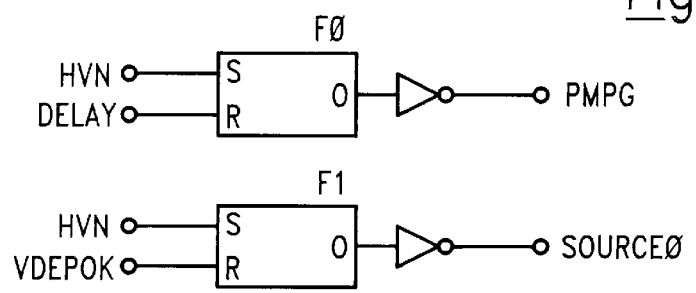

The control circuit CC shown in FIGS. 9 and 10 controls the activation of the charge circuit CHC and the discharge circuit DCHC.

As visible in FIG. 9, the control circuit CC includes a circuit branch 5 connected between the signal line VDEP and ground. Circuit branch 5 contains a P-channel depletion MOSFET M32 with source connected to VDEP, drain connected to an N-channel MOSFET M33, and ground terminal connected through an N-channel MOSFET M34. M33 is controlled by an output signal DISCH of a two-input NOR gate NOR1 supplied with the signal HVN and with a signal SOURCE0 which will be described below. M32 is controlled by an output signal of a two-input AND gate AND1 with a first input connected to the signal DISCH and a second input connected to the drain of M32. M34 is controlled by a voltage Iref with a value suitable to make M34 drain a current of approximately 80 μA. The output signal of AND also forms the enable signal PMPM of the first negative charge pump circuit 3 of the discharge-circuit DCHC of FIG. 8.

The control circuit CC also includes a second circuit branch 8, a third circuit branch 9 and a fourth circuit branch 10. The second circuit branch 8 contains a P-channel depletion MOSFET M47 and two diode-connected N-channel MOSFETs M48, M49 The third branch 9 contains a diode-connected P-channel MOSFET M50, an N-channel MOSFET M51 and a P-channel MOSFET M52 controlled by the signal VDEP. The fourth branch 10 includes a P-channel MOSFET M53, an N-channel MOSFET M54 and a P-channel depletion MOSFET M55 with gate tied to ground. MOSFETs M49, M52 and M55 are coupled to ground through an N-channel MOSFET M56. The drain electrode of M53 supplies a first inverter I8 which in turn supplies a second inverter I4. The input of I8 is coupled to VDD through a series connection of a P-channel MOSFET M56 and a P-channel MOSFET M57. I4 supplies a third inverter I5 whose output supplies a fourth inverter I6. The output of I6 forms a signal VDEPOK which will be described below. The signal VDEPOK controls a fifth inverter I7 which controls the MOSFET M56, and also controls a pull-up P-channel MOSFET M58 connected between the input of I8 and VDD.

The control circuit CC further includes two flip-flops F0, F1 of the set-reset type. The first flip-flop F0 has a set input supplied with the signal HVN; a reset input is supplied with a signal DELAY activated by the sequential machine. The output of F0, after a logic inversion, forms the enable signal PMPG of the charge pump circuit 4 of the discharge circuit DCHC. The second flip-flop F1 has a set input supplied with the signal HVN; a reset input is supplied with the signal VDEPOK. The output of F1, after a logic inversion, forms the signal SOURCE0.

Figure 11:
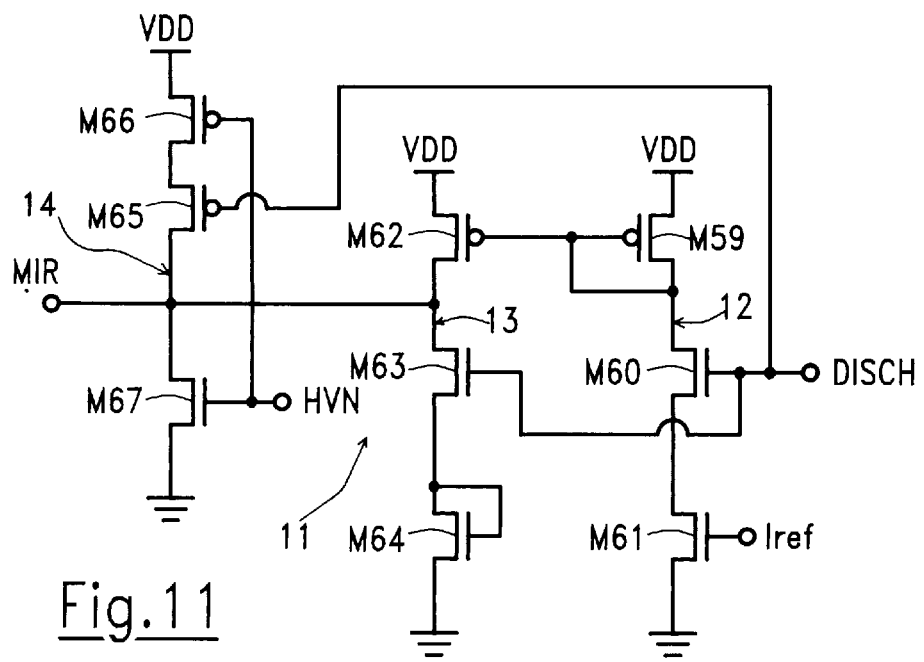
FIGS. 11 and 12 are diagrams of a circuit for controlling the potential of a common source line of a half-sector of the Flash EEPROM.
Figure 12:
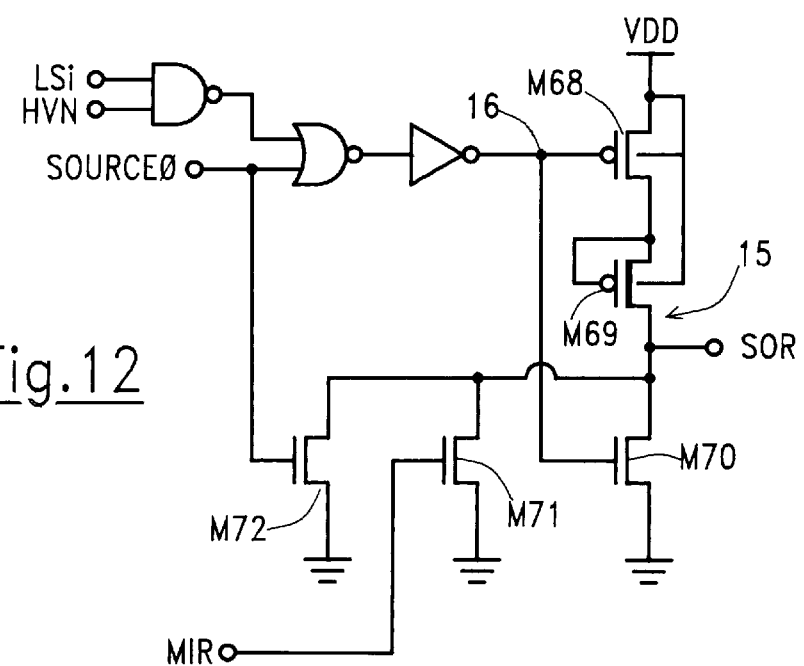

FIGS. 11 and 12 show one of the sixteen source switch circuits SWR, SWL for controlling the potential of the common source line SOR, SOL of a respective half-sector. With reference to FIG. 11, the circuit includes a current mirror 11 containing a first branch 12 and a second branch 13. The first branch 12 includes a diode-connected P-channel MOSFET M59, an N-channel MOSFET M60 controlled by the signal DISCH (FIG. 10), and an N-channel MOSFET M61 controlled by the voltage Iref. The second branch 13 includes a P-channel MOSFET M62, an N-channel MOSFET M63 controlled by the signal DISCH, and a diode-connected N-channel MOSFET M64. The drain of M62 forms an analog output signal MIR of the current mirror 11. Also shown in FIG. 11 is a circuit branch 14 having a P-channel MOSFET M66 controlled by the signal HVN, a P-channel MOSFET M65 controlled by the signal DISCH and an N-channel MOSFET M67 controlled by the signal HVN.

FIG. 12 shows the driving circuit for the common source line of an half-sector, for example a right half-sector SOR. The circuit includes a driving stage 15 having a P-channel MOSFET M68, a P-channel depletion MOSFET M69 and an N-channel MOSFET M70. The drain of M70 is connected to the common source line SOR of the half-sector. Also connected to the common source line SOR are an N-channel MOSFET M71 controlled by the analog signal MIR and an N-channel MOSFET M72 controlled by the signal SOURCE0. The MOSFETs M68 and M70 are controlled by a signal 16 which is equal to the boolean expression NOT(LSi AND HVN) OR SOURCE0.

The Flash EEPROM also includes a sequential machine, schematically shown in FIG. 13. As known, a sequential machine contains a combinatorial network COMB and a sequential network SEQ. The combinatorial network has a first set of inputs PIN, called primary inputs, which are the inputs of the sequential machine, and a first set of outputs POUT, called primary outputs, which are the outputs of the sequential machine. The combinatorial network also has a second set of inputs SIN, called secondary inputs, which are outputs of the sequential network SEQ, and a second set of outputs SOUT, called secondary outputs, which are fed to the sequential network SEQ. The sequential machine evolves through a succession of states; the current state of the sequential machine, i.e. the logic state of the primary outputs, depends not only on the current state of the primary inputs, but also on the state of the sequential network SEQ, which in turn depends on the previous history of the state machine. For example, the sequential network SEQ could be a ROM containing microinstructions which controls the combinatorial network COMB. The sequential machine implements the erasing algorithm which will be described hereinafter.

Figure 16:
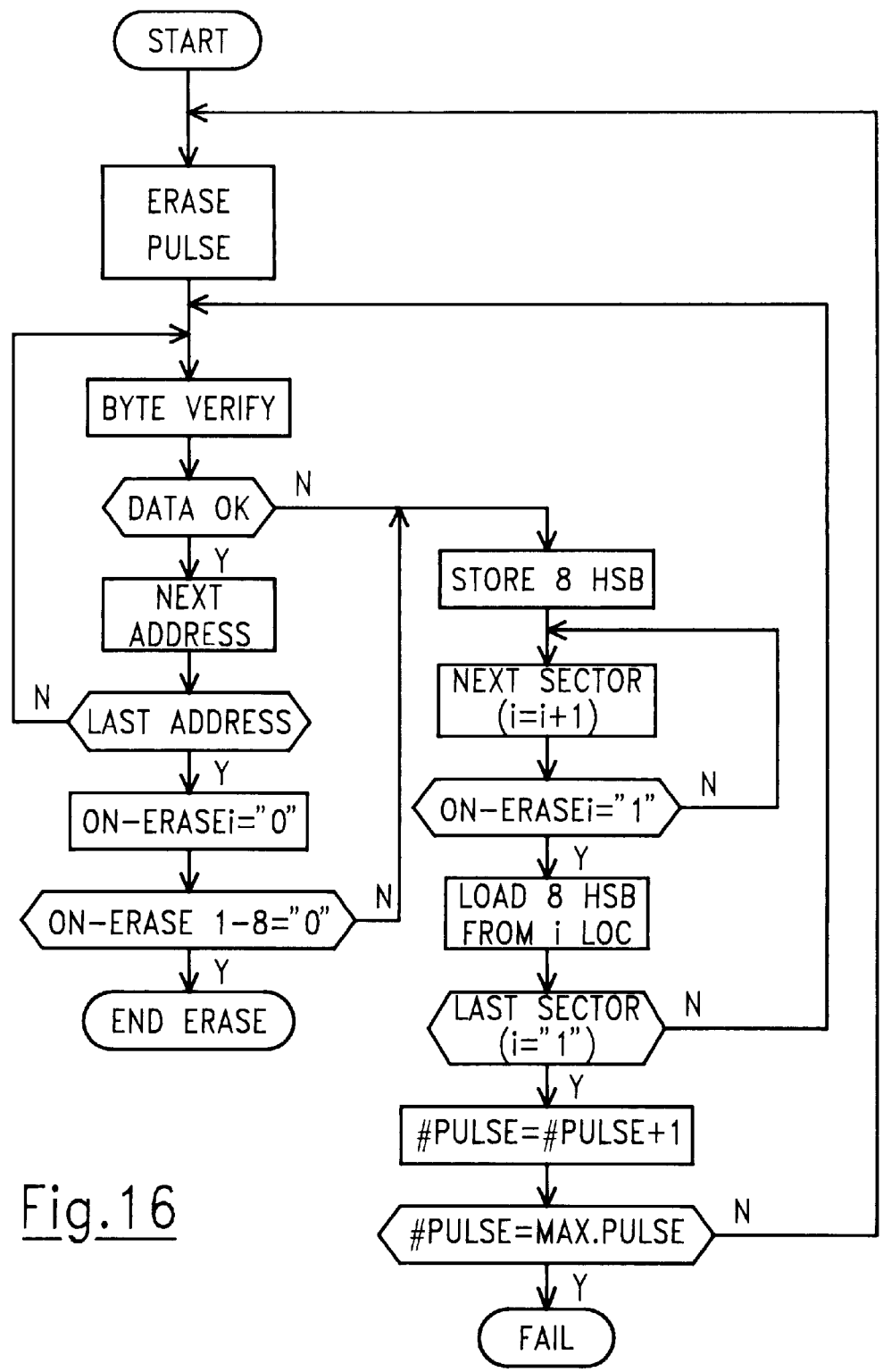
FIG. 16 is a flowchart of an erase algorithm implemented by the sequential machine of FIG. 13.

FIG. 16 is a flowchart of the erasing algorithm implemented by the sequential machine. Before the execution of this algorithm, the sequential machine must verify that all the memory cells belonging to the sectors which must be erased are programmed. If some memory cells in the sectors to be erased are not programmed, the sequential machine must program such memory cells. In this way, it is assured that all the memory cells in the sectors to be erased start from a common programmed condition.

The sequential machine uses an eight-bit memory register ON-ERASE and an eight-byte RAM, as discussed earlier with reference to FIGS. 14 and 15. Each bit in the memory register ON-ERASE corresponds to a respective one of the eight sectors S1–S8; if the bit i (i=1 . . . 8) in the memory register ON-ERASE is "1", the corresponding sector Si is to be applied an erase pulse. Each byte in the RAM corresponds to a respective one of the eight sectors S1–S8. And, as will be better described below, each byte is used by the sequential machine to store the eight most significant bits of the address of the first byte of the sector which, during the ERASED BYTE VERIFY performed after each erase pulse, is not read as an erased byte.

The first step in the erase algorithm provides for applying an erase pulse of about 10 ms to the memory cells in the sectors to be erased. In the example, the sectors to be erased are S3, S5 and S8, bits 3, 5 and 8 in the memory register ON-ERASE are "1". To determine which of the sectors the erase pulse is to be applied, the sequential machine reads the content of the memory register ON-ERASE to see which bits in this memory register are "1".

To apply an erase pulse to the memory sectors to be erased, the sequential machine activates the signal HVN. In each sector to be erased, the pump enabling signal ENPi goes high, and the associated negative charge pump circuit NPi is activated; the row decoder circuits RDR, RDL of the sectors to be erased are deactivated by keeping the first-level selection signals LX LX'or LY LY' low. The input of the final inverters I9 that drive the word lines is tied to VPCXSi by the pull-up MOSFETs M7; this means that all the MOSFETs M8 will be off and all the MOSFETs M10 will be on. The negative charge pump circuits 3, 4 in the discharge circuit DCHC are deactivated, PNPM and PMPG are "0", and the signal VDEP is biased by the charge circuit CHC to a voltage of approximately 4 V, so that in the row decoder circuits the depletion MOSFETs M9 are off; the word lines can thus be biased by the negative voltage VPi of the respective negative charge pump circuit NPi. The common source lines SOR, SOL of the half-sectors to be erased are connected to VDD (SOURCE0="0", LSi=HVN="1", MIR= "0"), and the bit lines are left floating. Also, as previously explained in connection with FIG. 6, when the voltage VPi reaches a voltage of approximately –2.5 V, the well (bulk electrode) of the word line diodes in the blocks DR, DL and the well of the diodes M14, M15 of the last stages of the negative charge pump circuit NPi is switched to ground, to reduce the stress of the junctions and the body effect of said diodes. In the sectors which are not to be erased, being LSi="0", even if HVN="1" the pump enable signal ENPi remains low, and the respective negative charge pump circuit NPi is not activated; the signal VPi is tied to the signal DWSi, which in turn is equal to VPCXSi equal to VDD. Also, the common source lines are connected to ground through the MOSFETs M72 as illustrated in FIG. 12.

After approximately 10 ms, the erasing pulse ends: the sequential machine disactivates the signal HVN. The detailed explanation of this phase will be given in the following of this description.

After the first erasing pulse, the condition of the memory cells in the sectors to be erased is verified. The sequential machine has an internal address counter ADDCNT illustrated in FIG. 15. Since in the present example each sector contains 512 kbits, which means that each sector contains 64 kbytes, the address counter ADDCNT must be a 16-bit counter. The sequential machine uses the 16-bit address counter ADDCNT to internally generate in succession the addresses of all the memory bytes of each sector, in order to verify if the memory cells have actually been erased. As previously noted, in ERASE BYTE VERIFY phase the voltage VPCX is equal to 4 V, margin-mode reading of the erased memory cells. In the shown example, the sequential machine initially selects sector S3. If all the memory cells of sector S3 are erased, the sequential machine writes a "0" in the corresponding bit i=3 of the memory register ON-ERASE. Then the sequential machine selects the next sector under erase, in the example sector S5, and again the sequential machine internally generates in succession the addresses of all the memory bytes of this sector. If also sector S5 has been completely erased, the sequential machine writes a "0" in the bit i=5 of the memory register ON-ERASE. Then the sequential machine selects the last sector under erase, i.e. S8, and performs the same operation. If after the first erasing pulse all the memory cells in the memory sectors under erase are erased, the erase algorithm stops.

If differently during the ERASED BYTE VERIFY step after the first erasing pulse in some of the sectors under erase, for example sector S3, one byte is encountered which has not been erased, the sequential machine stores the address of this byte in the location LOC=3 of the RAM corresponding to sector S3 (in the shown embodiment, only the most significant eight bits of the address are stored in the RAM). Then the sequential machine interrupts the ERASED BYTE VERIFY procedure of sector S3, leaves a "1" in the bit i=3 of the memory register ON-ERASE corresponding to sector S3, and starts to verify the next sector S5. The same happens if one byte in sector S5 is encountered that has not been erased.

When the last sector under erase has been verified, the sequential machine increments an erase pulse counter and applies a second erase pulse only to those sectors for which the corresponding bit i in the register ON-ERASE is a "1". In other words, the second erase pulse is applied only to those sectors which contains memory cells which have not been erased by the first erasing pulse.

After the second erase pulse, the sequential machine again performs an ERASED BYTE VERIFY only for those sectors which have been submitted to the second erase pulse. For each one of these sectors, the sequential machine internally generates in succession the addresses of the memory bytes of the sectors, starting however from the address stored in the location LOC of the RAM corresponding to the sector which is currently under verify.

The sequential machine repeats all the previous operations until all the memory cells of the sectors under erase are really erased (i.e. when all the bits in the memory register ON-ERASE are "0"), or until a maximum number of erase pulses is reached; in the latter case, the sequential machine activates a signal informing the user that the erase of the memory device has failed.

During an erase pulse, the word lines of the sectors under erase are biased at VPi minus the threshold voltage of the word line diodes DR, DL (approximately −8 V) and the common source lines SOR, SOL are biased at VDD (5 V). This means that the word line capacitances and the common source line capacitances are respectively charged to −8 V and 5 V. The word line capacitance is the sum of the control gate capacitance of all the memory cells connected to a given word line. The control gate capacitance of a memory cell is the coupling capacitance between the control gate and all the other electrodes of the memory cell. In the Flash EEPROM of the present example, the measured value of the control gate capacitance is 1.2 fF. Since in the present example each half-sector contains 1024*256 memory cells, the overall word line capacitance for a given half-sector is approximately 300 pF. The common source line capacitance is the sum of the source capacitances of all the memory cells of a given half-sector; the source capacitance of a memory cell is the coupling capacitance between the source electrode and all the other electrodes of the memory cell. A measured value of the source capacitance is 1.5 fF; it follows that for a given half-sector the overall common source line capacitance is approximately 400 pF.

At the end of an erase pulse, the word line voltage and the common source line voltage must be brought to the ground voltage. In this phase it is necessary to control the discharge of the word line capacitance and of the common source line capacitance, to prevent large currents from flowing in the metal interconnection lines which deliver the external power supplies VDD and ground to the internal circuits of the memory device. For example, for metal lines with a typical thickness of 8000 Å, the maximum current that can flow in the metal line without causing electromigration problems is approximately 8 mA per micron of width of the metal line. Assuming that the VDD and ground metal lines have a width of about 50 $\mu$m, the maximum current that can flow is approximately 40 mA. Considering that all the eight memory sectors can be erased at the same time, the minimum discharge time of the word line capacitance and common source line capacitance of a half-sector is 1.5 $\mu$s.

The circuits of FIGS. 7–12 make possible to control the discharge time of the word line capacitance and of the common source line capacitance of the half-sectors which have been submitted to an erase pulse.

At the end of an erase pulse, the sequential machine drives the signal HVN to "0". The negative charge pump circuits NP1–NP8 are thus deactivated (ENPi="0"), the charge circuit CHC of the signal VDEP is deactivated, MOSFET N29 turns off, the signal DISCH switches to "1" activating the current mirror 11 of FIG. 11; the signal SOURCE0 went low at the beginning of the erase pulse, when the transition of HVN to "1" set the flip-flop F0. MOSFET M33 in the branch 5 of the control circuit CC is also turned on. The negative charge pump circuits 3, 4 of the discharge circuit DCHC are still deactivated, since the signals PMPM and PMPG are still "0". The signal VDEP, initially at a voltage of 4 V, starts to be discharged by the constant current of 80 $\mu$A provided by MOSFET M34, biased by the voltage Iref. When the signal VDEP has sufficiently decreased, the output PMPM of AND1 switches to "1", turning M32 off: this stops the constant current discharge of VDEP. The negative charge pump circuit 3 of the discharge circuit DCHC is activated, and the voltage VDEP starts to be pumped toward −4 V. After a given time delay, controlled by the sequential machine, a signal DELAY is activated, causing the flip-flop F1 to reset; the signal PMPG switches to "1", activating the negative charge pump circuit 4 in the discharge circuit DCHC. This second negative charge pump circuit 4 provides a more rapid discharge of VDEP towards −4 V. Referring to FIG. 3, the row decoder circuits are still deactivated by the fact that the first-level selection signals LX . . . LX' or LY . . . LY' are kept low, however, the slow discharge of the signal VDEP from 4 V to −4 V causes the depletion P-channel MOSFETs M9 to gradually turn on. The word line capacitance, charged at −8 V, will gradually discharge to zero by the current flowing from the ground metal line.

At the same time, as soon as the transition of the signal DISCH to "1" activates the current mirror 11, the signal MIR biases the MOSFET M71 in the circuit of FIG. 12 to sink a constant current of approximately 400 µA; this allows the gradual discharge of the common source line SOR, SOL of the half-sectors. After a given time delay, provided by the circuit of FIG. 9, the signal VDEPOK goes to "1", thus resetting the flip-flop F1. When the voltage VDEP has become sufficiently negative, M52 sinks a larger current than M55, inverter I8 switches, and after a delay determined by a capacitor C10, as shown in FIG. 9, VDEPOK switches to "1". The signal SOURCE0 is thus switched to "1", causing the MOSFET M72 in the circuit of FIG. 12 having a large aspect ratio to turn on. The common source line capacitances of the half-sectors are thus rapidly discharged to zero.

FIG. 17 is a time diagram of the signals VPi, VWL, VDEP, and of the common source line SOR, SOL. It is possible to see that the curve VDEP has a first portion A corresponding to the constant current discharge through the circuit branch 5 of FIG. 9, a second portion B corresponding to the discharge by means of the negative charge pump circuit 3 of the discharge circuit DCHC, and a third portion C corresponding to the discharge by means of the second negative charge pump circuit 4 of DCHC. Also, it can be noted that the curve SOR, SOL has a portion D corresponding to the constant current discharge through the MOSFET M71 of FIG. 12, controlled by the signal MIR. In FIG. 17, the curve VWL represents the potential of one of the word lines of the sectors which have been submitted to the erase pulse.

It is to be noted that, thanks to the controlled discharge of the word line and common source line capacitances according to the present invention, the discharge current of the common source line capacitance is used to partially discharge the word line capacitance. The current actually flowing in the ground metal line which delivers the ground voltage inside the memory device is thus the difference between the two discharge currents.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method, comprising:
   programming a plurality of memory cells associated to a word line, each cell having a control gate and a pair of source/drain region, by charging a control-gate capacitance of said plurally of memory cells that is associated with the control gate to a first voltage; and
   after the programming, limiting a first discharge current that flows from the control-gate capacitance of said plurality of memory cells to a value that is no greater than a first predetermined maximum value.

2. The method of claim 1 where:
   the programming further comprises charge a source/drain capacitance that is associated with one of the source/drain regions to a voltage; and
   the limiting further comprises limiting a second discharge current that flows from the source/drain capacitance to a value that a second predetermined maximum value.

3. The method of claim 1, wherein:
   the programming further comprises charging a source/drain capacitance that is associated with one of the source/drain regions to a second voltage and electrically floating the other of the source/drain regions; and
   the limiting further comprises limiting a second discharge current that flows from the source/drain capacitance to a value that is no greater than a second predetermined maximum value.

4. The method of claim 2 wherein:
   the first voltage comprises a negative voltage; and
   the second voltage comprises a positive voltage.

5. The method of claim 1 wherein:
   the programming further comprises charging a source/drain capacitance that is associated with one of the source/drain regions to a second voltage; and
   the limiting further comprises,
      limiting a second discharge current that flows from the source/drain capacitance to a value that is no greater than a second predetermined maximum value, and
      allowing the second discharge current to flow for a predetermined time before allowing the first discharge current to flow.

6. A method, comprising:
   storing a value in a plurality of memory cells associated to a word line, each cell having a control gate, a source, and a drain, by charging a control-gate capacitance of said plurality of memory cells that is associated with the control gates to a first voltage; and
   after the storing, discharging the control-gate capacitance of said plurality of memory cells over a first time period that is no less than a first predetermined minimum duration.

7. The method of claim 6 wherein:
   the storing further comprises charging a source capacitance that is associated with the source to a second voltage; and
   the discharging further comprises discharging the source capacitance over a second time period that is no less than a second predetermined minimum duration.

8. The method of claim 6 wherein:
   the storing further comprises charging a source capacitance that is associated with the source to a second voltage and electrically floating the drain; and
   the discharging further comprises discharging the source capacitance over a second time period that is no less than a second predetermined minimum duration.

9. The method of claim 7 wherein:
   the first voltage comprises a negative voltage; and
   the second voltage comprises a positive voltage.

10. The method of claim 6 wherein:
    the storing further comprises charging a source capacitance that is associated with the source to a second voltage; and
    the limiting further comprises,
       discharging the source capacitance over a second time period that is no less than a second predetermined minimum value, and
       wherein the second time period begins before the first time period.

11. A method, comprising:
    programming a plurality of memory cells associated to a word line, each cell having a control gate and a pair of source/drain regions, by charging a control-gate capacitance of said plurality of memory cells that is associated with the control gates to a first voltage; and after the programming, controlling a discharge of the control-gate capacitance of said plurality of memory cells according to predetermined criteria.

12. The method according to claim 11 wherein the predetermined criteria comprises an amplitude of discharged current; and controlling the discharge includes:

limiting the discharge current to a value that is no greater than a first predetermined maximum value.

13. The method of claim 11 wherein the predetermined criteria comprises a time period for discharge; and controlling the discharge includes:

discharging the control-gate capacitance over a first time period that is no less than a first predetermined minimum duration.

* * * * *